(12) United States Patent
Chan et al.

(10) Patent No.: US 6,492,736 B1
(45) Date of Patent: Dec. 10, 2002

(54) POWER MESH BRIDGE

(75) Inventors: Chun Chan, Sunnyvale, CA (US); Bo Shen, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 15 days.

(21) Appl. No.: 09/808,441

(22) Filed: Mar. 14, 2001

(51) Int. Cl.[7] .............................................. H01L 23/48
(52) U.S. Cl. ...................... 257/773; 257/750; 257/758; 257/920
(58) Field of Search ................. 257/207, 750, 257/758, 773, 920; 438/622, 652; 174/261; 716/20

(56) References Cited

U.S. PATENT DOCUMENTS

| | | | | |
|---|---|---|---|---|
| 4,673,966 A | * | 6/1987 | Shimoyama | 257/211 |
| 4,982,266 A | * | 1/1991 | Chatterjee | 257/66 |
| 5,060,050 A | * | 10/1991 | Tsuneoka et al. | 257/758 |
| 5,723,908 A | * | 3/1998 | Fuchida et al. | 257/758 |
| 5,869,900 A | * | 2/1999 | Crafts | 257/758 |
| 5,886,371 A | * | 3/1999 | Shinagawa | 257/207 |
| 6,075,712 A | * | 6/2000 | McMahon | 361/783 |
| 6,187,660 B1 | * | 2/2001 | Gardner | 438/622 |
| 6,262,487 B1 | * | 7/2001 | Igarashi et al. | 257/758 |
| 6,331,733 B1 | * | 12/2001 | Or-Bach et al. | 257/758 |
| 6,344,371 B2 | * | 2/2002 | Fischer et al. | 438/106 |

FOREIGN PATENT DOCUMENTS

| | | | | |
|---|---|---|---|---|
| JP | 3-60-034039 | * | 2/1985 | 438/622 |
| JP | 4-3-263855 | * | 11/1991 | 257/758 |
| JP | 4-3-274764 | * | 12/1991 | 257/758 |

* cited by examiner

Primary Examiner—George C. Eckert, II
(74) Attorney, Agent, or Firm—Trexler, Bushnell, Giangiorgi, Blackstone & Marr, Ltd.

(57) ABSTRACT

A multiple layer mesh design that provides that a bridge associated with a second layer connects a rail on a first layer to a trunk on a fourth layer. If the trunk on the third layer shadows a plurality of rails on the first layer, preferably the bridge is at least as wide as a sum of the widths of the rails on the first layer which are shadowed by the trunk on the third layer. If the trunk on the third layer shadows a single rail on the first layer, preferably the bridge is at least as wide as twice the width of the rail on the first layer.

15 Claims, 2 Drawing Sheets

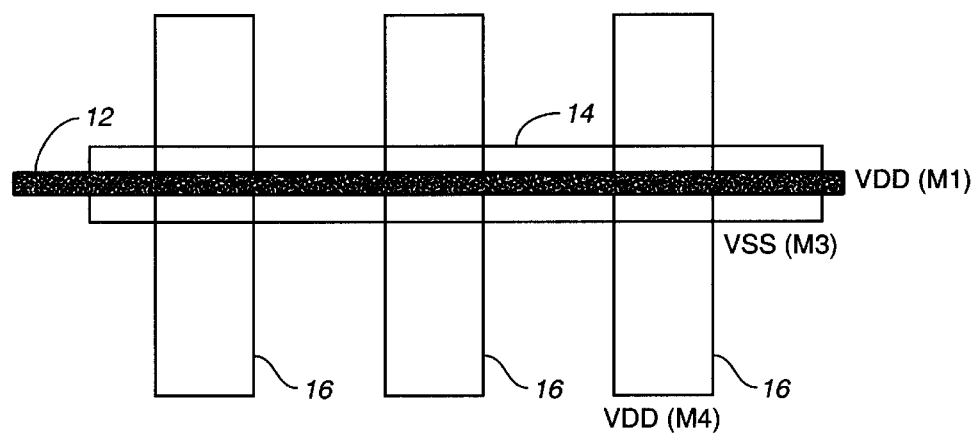
FIG._1 (PRIOR ART)
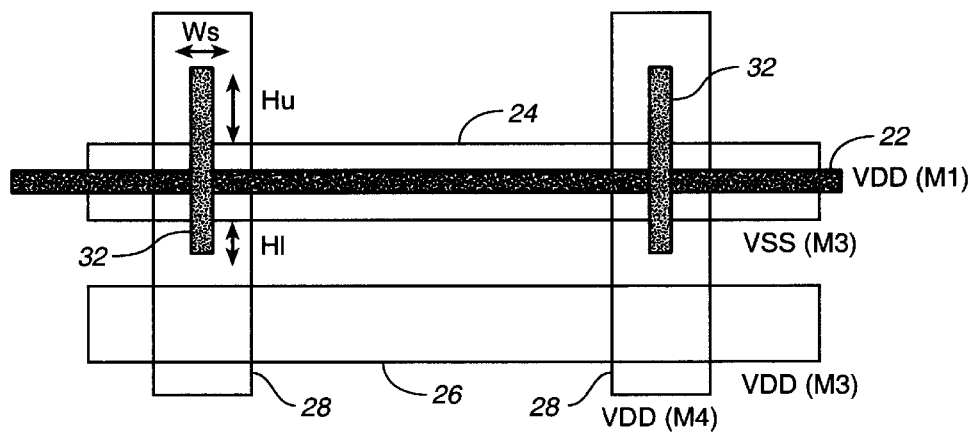
FIG._2

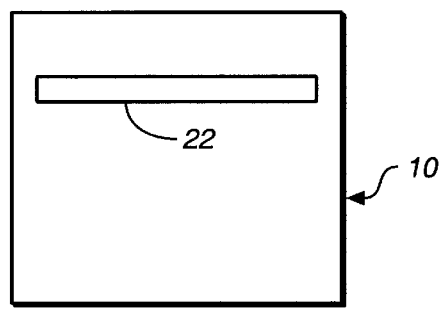
FIG._3a
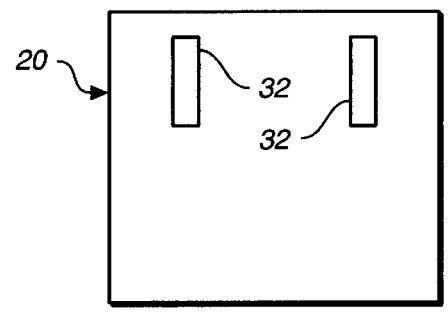
FIG._3b
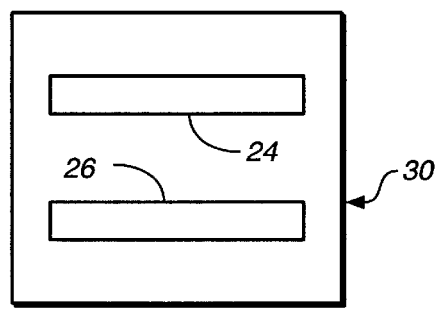
FIG._3c
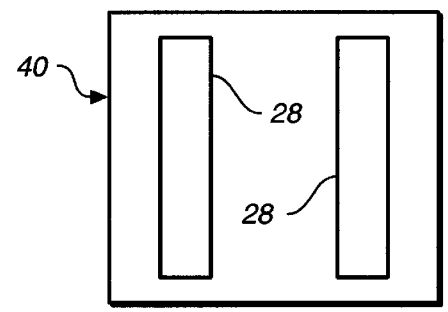
FIG._3d

POWER MESH BRIDGE

BACKGROUND

This invention generally relates to power meshes, and more specifically relates to a power mesh design that includes a bridge for connecting a rail on one layer to a trunk on another layer.

In a four layer circuit design (wherein the layers are M1, M2, M3 and M4), if a standard row of cells is under the M3 horizontal mesh, it is impossible for one of the rails (either Vss or Vdd) on M1 to connect (through vias) up to the M4 portion of the mesh. Shadowing of the rail on M1 effectively denies access to the M4 truck. Hence, cells are left unpowered.

This disadvantage is illustrated in FIG. 1. FIG. 1 illustrates portions of a four layer design (wherein the layers are M1, M2, M3 and M4). A Vdd rail 12 is disposed on M1, a Vss trunk 14 is disposed on M3, and three Vdd trunks 16 are disposed on M4. As shown, because the Vss trunk 14 which is disposed on M3 shadows the Vdd rail 12 on M1, access of the Vdd trunks 16 on M4 to the Vdd rail 12 on M1 is denied. Hence, cells on M4 are left unpowered. It would be advantageous to provide power to cells on one layer (such as M4 in a four layer mesh design) using a rail on another layer (such as a rail on M1 in a four layer mesh design), even though the rail is shadowed by a trunk on a layer between the two layers.

OBJECTS AND SUMMARY

A general object of an embodiment of the present invention is to provide a multiple layer mesh design which provides that cells on one layer are powered using a rail on another layer, even though the rail is shadowed by a trunk on a layer between the two layers.

Another object of an embodiment of the present invention is to provide a multiple layer mesh design which provides a bridge from a rail disposed on one layer to a trunk disposed on another layer.

Still another object of an embodiment of the present invention is to provide a four layer mesh design which provides a bridge associated with a second layer, where the bridge effectively connects a rail on a first layer to a trunk on a fourth layer even though a trunk on the third layer at least partially overshadows the rail on the first layer.

Briefly, and in accordance with at least one of the foregoing objects, an embodiment of the present invention provides a multiple layer mesh design that includes a first layer having at least one rail, a second layer having at least one bridge associated therewith, a third layer having a trunk, where the trunk at least partially shadows the at least one rail on the first layer, and a fourth layer having at least one trunk, where the at least one bridge associated with the second layer connects the at least one rail on the first layer to the at least one trunk on the fourth layer. If the trunk on the third layer shadows a plurality of rails on the first layer, preferably the width of the at least one bridge is generally equal to a sum of the widths of the rails on the first layer which are shadowed by the trunk on the third layer. If the trunk on the third layer shadows a single rail on the first layer, preferably the width of the at least one bridge is at least twice the width of the rail on the first layer. Preferably, the bridge includes an upper overhang which is dependent upon a number of vias which are on the fourth layer, the third layer and the second layer. Preferably, the bridge includes a lower overhang which is generally equal to a width of the at least one rail which is on the first layer. Preferably, a via population from the trunk on the fourth layer to the at least one bridge associated with the second layer is 100%, and a via population from the at least one bridge associated with the second layer to the at least one rail on the to first layer is 100%. The multiple layer mesh design may include four layers.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which:

FIG. 1 is a schematic diagram of a prior art mesh design;

FIG. 2 is a schematic diagram of a mesh design which is in accordance with an embodiment of the present invention;

FIGS. 3a–3d are schematic diagrams showing each of the four layers of the mesh design shown in FIG. 2.

DESCRIPTION

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

An embodiment of the present invention provides a mesh design which provides that cells on one layer are powered using a rail on another layer, even though the rail is shadowed by a trunk on a layer between the two layers. Specifically, a bridge is provided, and the bridge connects the rail to the trunk.

As shown in FIGS. 2 and 3a–3d, one embodiment of the present invention provides a four layer mesh design (4LM) which includes a first layer M1 (10), a second layer M2 (20), a third layer M3 (30) and a fourth layer M4 (40). The first layer M1 (10) is shown in FIG. 3a, the second layer M2 (20) is shown in FIG. 3b, the third layer M3 (30) is shown in FIG. 3c and the fourth layer M4 (40) is shown in FIG. 3d. Of course, the present invention may also be used in association with a mesh design that has a different number of layers. The concept of the power mesh bridge routing disclosed herein is independent of the number of metal layers in the design. Nevertheless, FIGS. 2 and 3a–3d illustrate a four layer mesh configuration which incorporates power mesh bridge routing which is in accordance with the present invention. While there are other components of each of the four layers which are not specifically shown in FIGS. 2 and 3a–3d, FIGS. 2 and 3a–3d show those portions which are relevant to describing an embodiment of the present invention.

As shown, a rail 22, such as a Vdd rail, is disposed on the first layer M1 (10). Of course, other rails, such as a Vss rail, may be provided on M1. A Vss trunk 24 as well as a Vdd trunk 26 is provided on M3. As shown in FIG. 2, the Vss trunk 24 on M3 shadows the Vdd rail on M1. A plurality of Vdd trunks 28 are provided on M4, and a plurality of straps or bridges 32 associated with M2 connect the Vdd rail 22 on M1 to the Vdd trunks 28 on M4. Hence, cells on M4 can be powered by the Vdd rail 22 on M1 even though the Vdd rail 22 on M1 is shadowed by the trunk 24 on M3.

The rail current ($I_{Rail}$) of the Vdd rail 22 on M1 can be calculated from the following equation:

$$I_{Rail}=\{I_{Gate}*((200\ \mu m)/H_{Gate}*F_{colUtil})*C_{freq}*A_F\} \quad (1)$$

Where, $I_{Rail}$=current in the rail $I_{Gate}$=Current/Gate/MHZ=0.105 $\mu$A/MHZ (assuming a G12 design)

$H_{Gate}$=gate height=1.92 $\mu$m (assuming a G12 design)

$F_{colUtil}$=Column Utilization=0.9

$C_{freq}$=clock frequency $A_F$=Activity factor

In the scenario shown in FIG. 2 (and FIGS. 3a–3d), the minimum width required would be determined by electromigration requirements. As an example, a G12 design is considered, with a clock frequency of 500 MHZ and an Activity factor of 50%. The rail current would be 2.46 mA. The EM limit for the bridges on M2 is 1.68 mA/$\mu$m in G12. Hence, the minimum width of each bridge associated with M2 required to connect the shadowed Vdd rail 22 (on M1) to a Vdd trunk 28 (on M4) is 2.46/1.68=1.46 $\mu$m≡width of the Vdd rail 22 on M1.

If there are two rails (22 and another rail) on M1 being shadowed by the same trunk 24 on M3, then each bridge 32 associated with M2 should be able to sustain twice the amount of current. Hence, the minimum width of each bridge 32 would be 2*(1.46 $\mu$m) which is approximately 2* the width of one of the shadowed rails.

The minimum number of vias from M4 to the bridge 32 associated with M2 can be determined by dividing the $I_{Rail}$ by the EM limit of Via2 (0.29 mA). For the example described above, the minimum number of vias would be 2.46/0.29, or 8 vias. The bridge 32 associated with M2 for connecting to the rail 22 on M1 should be fully populated with vias.

From an implementation standpoint, it may be cumbersome to input all the values into the $I_{Rail}$ equation (equation 1 above). A cleaner, albeit conservative approach is to estimate the maximum rail current based on the EM limit of M1, wherein $$I_{Rail}=\{\text{width of M1 rail}\}*(\text{EM Limit of M1}). \quad (2)$$

Preferably, when a trunk on M3 shadows one or more rails on M1, then a bridge associated with M2 is used to connect each rail on M1 to each trunk on M4. Due to the above calculations, if a plurality of rails are shadowed, preferably the width of each bridge which is used is equal to or greater than the sum of the widths of the rails (either Vss or Vdd) that are on M1 and which are shadowed by the trunk on M3. On the other hand, if a single rail is shadowed, preferably the minimum width of the bridge associated with M2 which is used is at least twice the width of the one rail which is shadowed. In FIG. 2, the width of each bridge 32 is indicated with "$W_s$" and an associated arrow.

As shown in FIG. 2, preferably each bridge 32 associated with M2 has an upper overhang (indicated with "$H_u$" and an associated arrow) and a lower overhang (indicated with "$H_l$" and an associated arrow). Preferably, the upper overhang ($H_u$) is determined by the minimum number of vias from M4 to M2. The minimum number of vias from M4 to M2 can be determined by dividing the $I_{Rail}$ by the EM limit of Via2. Wherein the total number of vias required, $N_v$, is equal to $I_{Rail}$ divided by the EM limit of Via2. If the width of the M2 bridge ($W_s$)≧2*{width of Via2+Via2 spacing+M3 overhang of Via2}, then $$H_u=\{(Nv/2)*(\text{width of Via2+Via2 spacing+M3 overhang of Via2})\}+(M3—M3\ \text{spacing}),$$

else $$H_u=\{(Nv)*(\text{width of Via2+Via2 spacing+M3 overhang of Via2})\}+(M3—M3\ \text{spacing}).$$

Of course, there can be cases where there is a partial shadowing of a rail on the M1 by a trunk on M3. In order to accommodate this scenario, it is preferred that the lower overhang ($H_l$) of the bridge associated with M2 be at least equal to the width of the rail on M1. Additionally, it is preferred that the via population from the trunk on M4 to the bridge associated with M2 be 100%, and the via population from the bridge associated with M2 to the rail on M1 be 100%.

As discussed above, by providing one or more bridges associated with M2, one or more rails on M1) which are shadowed by a trunk on M3 can be connected to one or more trunks on M4. Hence, cells on M4 can be powered by rails on M1 that are shadowed by a trunk therebetween.

While an embodiment of the present invention is shown and described, it is envisioned that those skilled in the art may devise various modifications of the present invention without departing from the spirit and scope of the appended claims.

What is claimed is:

1. A multiple layer mesh design comprising:
   a first layer having at least one rail;
   a second layer having at least one bridge associated therewith;
   a third layer having a trunk, said trunk at least partially shadowing said at least one rail on said first layer; and
   a fourth layer having at least one trunk, said at least one bridge associated with said second layer connecting said at least one rail on said first layer to said at least one trunk on said fourth layer.

2. A multiple layer mesh design as recited in claim 1, wherein a via population from the trunk on the fourth layer to the at least one bridge associated with the second layer is substantially all.

3. A multiple layer mesh design as recited in claim 1, wherein a via population from the at least one bridge associated with the second layer to the at least one rail on the first layer is substantially all.

4. A multiple layer mesh design as recited in claim 1, wherein said multiple layer mesh design includes four layers.

5. A multiple layer mesh design comprising:
   a first layer having a plurality of rails, each said rail having a width;
   a second layer having at least one bridge associated therewith, each said bridge having a width;
   a third layer having a trunk, said trunk at least partially shadowing said plurality of rails on said first layer;
   a fourth layer having at least one trunk, said at least one bridge associated with said second layer connecting said plurality of rails on said first layer to said at least one trunk on said fourth layer; and
   wherein said width of said at least one bridge being generally equal to a sum of the widths of the rails on the first layer which are shadowed by said trunk on said third layer.

6. A multiple layer mesh design comprising;

a first layer having a single rail;

a second layer having at least one bridge associated therewith;

a third layer having a trunk said trunk at least partially shadowing said single rail on said first layer; and a fourth layer having at least one trunk, wherein said single rail has a width and said at least one bridge associated with said second layer has a width, said width of said at least one bridge being at least twice the width of said single rail on said first layer.

7. A multiple layer mesh design comprising;

a first layer having at least one rail;

a second layer having at least one bridge associated therewith, wherein said at least one bridge includes a lower overhang which is generally equal to width of said at least one rail;

a third layer having a trunk, said trunk at least partially shadowing said at least one rail on said first layer; and a fourth layer having at least one trunk, said at least one bridge associated with said second layer connecting said at least one rail on said first layer to said at least one trunk on said fourth layer.

8. A multiple layer mesh design comprising:

a first layer having at least one rail, said first layer having an electromigration limit and said at least one rail having a width;

a second layer having at least one bridge associated therewith;

a third layer having a trunk, said trunk at least partially shadowing said at least one rail on said first layer; and a fourth layer having at least one trunk, said at least one bridge associated with said second layer connecting said at least one rail on said first layer to said at least one trunk on said fourth layer, and wherein a maximum rail current is defined by said width of said at least one rail on said first layer multiplied by said electromigration limit of said first layer.

9. A method of powering the cells on a layer in a multiple layer mesh design, said method comprising:

providing a multiple layer mesh design including a first layer having at least one rail, a second layer having at least one bridge associated therewith, a third layer having a trunk, said trunk at least partially shadowing said at least one rail on said first layer, and a fourth layer having at least one trunk; and using said at least one bridge associated with said second layer to connect said at least one rail on said first layer to said at least one trunk on said fourth layer.

10. A method as recited in claim 9, further comprising providing that a via population from the trunk on the fourth layer to the at least one bridge associated with the second layer is substantially all.

11. A method as recited in claim 9, further comprising providing that a via population from the at least one bridge associated with the second layer to the at least one rail on the first layer is substantially all.

12. A method as recited in claim 9, further comprising providing that said multiple layer mesh design includes four layers.

13. A method of powering the cells on a layer in a multiple layer mesh design, said method comprising:

providing a multiple layer mesh design including a first layer having a plurality of rails, a second layer having at least one bridge associated therewith, a third layer having a trunk, said trunk at least partially shadowing a plurality of rails on said first layer, wherein each of said rails on said first layer has a width and said at least one bridge associated with said second layer has a width, said width of said at least one bridge being generally equal to a sum of the widths of the rails on the first layer which are shadowed by said trunk on said third layer, and a fourth layer having at least one trunk; and using said at least one bridge associated with said second layer to connect said plurality of rails on said first layer to said at least one trunk on said fourth layer.

14. A method of powering the cells on a layer in a multiple layer mesh design, said method comprising:

providing a multiple layer mesh design including a first layer having a single rail, a second layer having at least one bridge associated therewith, a third layer having a trunk, said trunk at least partially shadowing said single rail on said first layer, wherein said single rail has a width and said at least one bridge associated with said second layer has a width, said width of said at least one bridge being at least twice the width of said single rail on said first layer, and a fourth layer having at least one trunk; and using said at least one bridge associated with said second layer to connect said single rail on said first layer to said at least one trunk on said fourth layer.

15. A method of powering the cells on a layer in a multiple layer mesh design, said method comprising:

providing a multiple layer mesh design including a first layer having at least one rail, a second layer having at least one bridge dissociated therewith, said at least one bridge including a lower overhang which is generally equal to a width of said at least one rail, a third layer having a trunk, said trunk at least partially shadowing said at least one rail on said first layer, and a fourth layer having at least one trunk; and using said at least one bridge associated with said second layer to connect said at least one rail on said first layer to said at least one trunk on said fourth layer.

* * * * *